(12) United States Patent
Kani et al.

(10) Patent No.: US 10,422,835 B2
(45) Date of Patent: Sep. 24, 2019

(54) INNOVATIVE FRAMEWORK COMBINING CYCLING AND CALENDAR AGING MODELS

(71) Applicant: NEC Laboratories America, Inc., Princeton, NJ (US)

(72) Inventors: Seyyed Ali Pourmousavi Kani, San Jose, CA (US); Ratnesh Sharma, Fremont, CA (US); Babak Asghari, San Jose, CA (US)

(73) Assignee: NEC Corporation (JP)

( * ) Notice: Subject to any disclaimer, the term of this patent is extended or adjusted under 35 U.S.C. 154(b) by 210 days.

(21) Appl. No.: 15/336,725

(22) Filed: Oct. 27, 2016

(65) Prior Publication Data

US 2017/0115358 A1    Apr. 27, 2017

Related U.S. Application Data

(60) Provisional application No. 62/246,807, filed on Oct. 27, 2015.

(51) Int. Cl.
*G01R 31/392*    (2019.01)
*G01R 31/367*    (2019.01)

(52) U.S. Cl.
CPC ......... *G01R 31/392* (2019.01); *G01R 31/367* (2019.01)

(58) Field of Classification Search
CPC .................................................. G01R 31/3679
See application file for complete search history.

(56) References Cited

U.S. PATENT DOCUMENTS

2010/0324846 A1* 12/2010 Marsh ................ G01R 31/3679
702/63
2015/0180090 A1*  6/2015 Duan .................. H01M 10/425
429/50

* cited by examiner

*Primary Examiner* — John E Breene
*Assistant Examiner* — Jeffrey C Morgan
(74) *Attorney, Agent, or Firm* — Joseph Kolodka

(57) ABSTRACT

Aspects of the present disclosure describe a single battery degradation model and methods that considers both CYCLING and CALENDAR aging and useful in both energy management and battery management systems that may employ any of a variety of known battery technologies.

1 Claim, 7 Drawing Sheets

INNOVATIVE FRAMEWORK COMBINING CYCLING AND CALENDAR AGING MODELS

CROSS REFERENCE TO RELATED APPLICATIONS

This application claims the benefit of U.S. Provisional Patent Application Ser. No. 62/246,807 filed Oct. 27, 2015 which is incorporated by reference as if set forth at length herein.

TECHNICAL FIELD

This disclosure relates generally to systems and methods for electrical generation, storage and distribution including microgrids and electric storage batteries. More particularly it pertains to determining an amount of electric battery degradation during their operation.

BACKGROUND

As is known, electric storage battery capacity degradation is generally caused by two different aging processes namely, CYCLING and CALENDAR aging. The CYCLING aging occurs due to battery charge and discharge activities over time. The CALENDAR aging occurs when a battery sits idle.

Given the importance of batteries to contemporary and future electric storage and distribution systems, methods that provide better control of these aging processes would represent a welcome addition to the art.

SUMMARY

An advance in the art is made according to the present disclosure which describes computer implemented methods that determines battery degradation that integrates both CYCLING and CALENDAR aging within a single framework. Advantageously, computer implemented methods according to the present disclosure employing CYCLING and CALENDAR aging in this integrated manner quick produce more reliable results in a more computationally efficient manner than prior art method(s). Given these benefits, methods according to the present disclosure may advantageously be employed in energy management systems (EMS) of microgrids and in particular home energy management systems and battery management systems of electric vehicles and/or other electric systems employing batteries.

The method extracts required information from a battery charge/discharge profile for a period of time—i.e., one day. Then, primary CYCLING and CALENDAR estimation is made based on the extracted information. After adjusting and checking the stability of the primary results, modified values are used and a final estimation is made from integrating the primary results.

Advantageously, methods according to the present disclosure are flexible and may accommodate any CYCLING and CALENDAR aging model(s). Of further advantage, any required parameters for each individual aging process are derived automatically from battery charge/discharge daily profile(s). Using the individual aging model(s) provided by a user, a primary estimation for the given battery charge/discharge profile is made, followed by an adjustment and stability check of the of the primary estimation, individual estimated values are generated and a final battery capacity estimation is produced.

Of further advantage, methods according to the present disclosure may advantageously accommodate any CYCLING and CALENDAR aging consideration without significant change(s)—other than individual CYCLING and CALENDAR aging models/data for a particular battery technology.

BRIEF DESCRIPTION OF THE DRAWING

A more complete understanding of the present disclosure may be realized by reference to the accompanying drawing in which.

Figure 1:
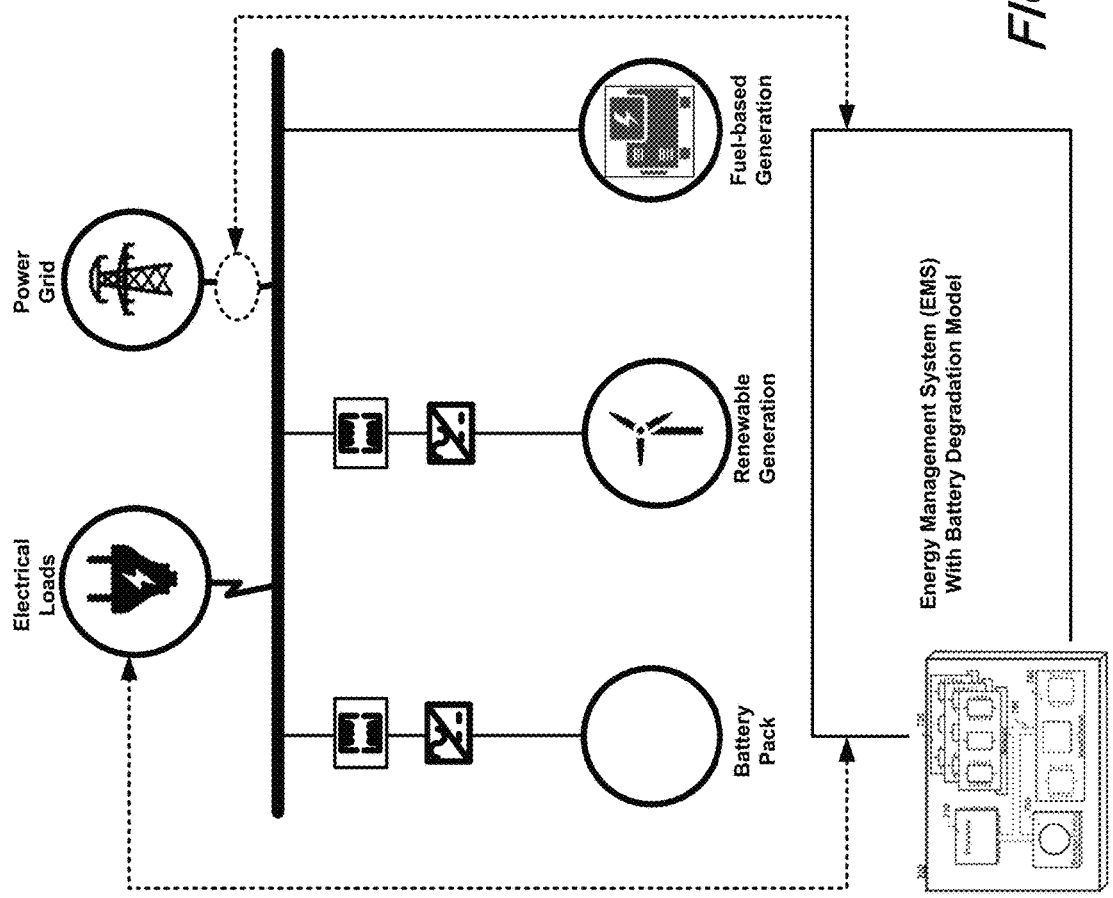
FIG. 1 is a schematic block diagram depicting an application of battery degradation model(s) in an energy management system (EMS) of a microgrid (MG) in both grid-tied and islanded mode(s) according to an aspect of the present disclosure.

The illustrative embodiments are described more fully by the Figures and detailed description. Inventions according to this disclosure may, however, be embodied in various forms and are not limited to specific or illustrative embodiments described in the Figures and detailed description.

DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The functions of the various elements shown in the Figures, including any functional blocks labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

Unless otherwise explicitly specified herein, the FIGs comprising the drawing are not drawn to scale.

By way of some additional background, we again note the importance of batteries as essential components for the safe and secure operation of microgrids (MGs). Recently, batteries have attracted much attention for large-scale grid-tied and off-grid applications in frequency regulation, voltage support, and demand charge minimization—among others. And while different battery technologies (such as Li-Ion) have shown significant reduction in price, they are still an expensive component part of systems of which they are included. Since they lose initial capacity and capability over their lifetime, their operation and degradation is an important factor to consider when designing effective energy management systems (EMS).

In order to account for battery degradation, it is necessary to estimate actual battery capacity during its lifetime. As part of this estimation, a battery degradation model is oftentimes employed.

As may be readily understood by those skilled in the art, battery aging is affected by two important factors, namely CYCLING and CALENDAR aging processes. CYCLING aging occurs when a battery is under charge or discharge while CALENDAR aging occurs when a battery sits idly. In an actual operational environment, both aging factors are important as their impact could significantly impact battery lifetime and its capacity fade. In a number of MG applications, batteries are oftentimes idle for a half of every day. As a result, both CYCLING and CALENDAR aging are important factors.

We note that previously we have explored a battery degradation model using statistical analyses and a neural network for CYCLING aging. Later, we enhanced that model to include CALENDAR aging as well. Notwithstanding our prior attempts, a combination of both processes within the same framework has not been explored or disclosed.

Integrating CYCLING and CALENDAR Aging Models

FIG. 1 shows a schematic diagram depicting an application of a battery degradation model according to the present disclosure for an EMS of a MG in a grid-tied and islanded mode. As may be understood from inspection of FIG. 1, the MG may operate in either an off-grid or a grid-tied mode. As may be appreciated, a battery storage unit in such a system requires an EMS to operate economically. Additionally, it is important to consider battery degradation in its daily operation. Notably, charge/discharge commands communicated to a battery inverter may be modified by the EMS to better operate the battery based on its aging characteristics. When an accurate degradation model is available, the EMS may employ such a model in its operation.

Figure 2:
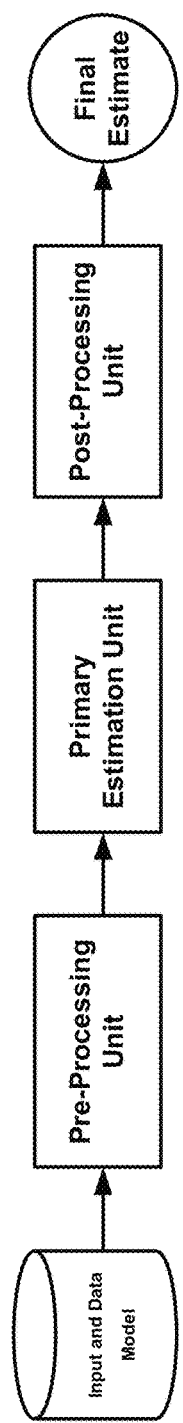
FIG. 2 is a schematic flow diagram depicting a generalized integration framework according to the present disclosure according to an aspect of the present disclosure.

FIG. 2 shows a flow diagram depicting a generalized integration framework according to the present disclosure. As shown in FIG. 1, a Pre-Processing unit extracts required data from given input parameters and data. Next, primary CYCLING and CALENDAR aging are estimated in a Primary Estimation Unit. Subsequently—after processing the results in a Post-Processing Unit, final estimation considering both CYCLING and CALENDAR aging is made.

At this point, we note the following premises with respect to systems and methods according aspects of the present disclosure.

Premise 1.

To combine CYCLING and CALENDAR aging, it is necessary to use an individual degradation model of each. Advantageously, methods and framework(s) according to the present disclosure permit use of different individual models of any type. More particularly, a framework according to the present disclosure may be easily adapted to any cyclic individual CYCLING and CALENDAR aging models. When new individual model(s) are available, the Pre-Processing Unite may be changed to accommodate new input parameters specific to the new model(s), and to replace any old individual models with newer ones namely in "CYC ANN Model" and "CAL ANN Model" blocks.

Premise 2.

CYCLING aging occurs when a battery is undergoing charge or discharge. CALENDAR aging occurs when a battery remains idle.

Premise 3.

CYCLING aging and CALENDAR aging are completely decoupled from one another and their integrated impact on battery degradation is superimposed. One exception to this premise is that battery storage (State of Charge) SOC at the beginning of an idle period may be affected by a prior battery operation.

Input Data and Model

As will be understood and appreciated by those skilled in the art, each of the two degradation processes namely, CYCLING and CALENDAR aging, are affected by different parameters and mechanisms. The rate of CYCLING aging is determined by different factors such as charge and discharge rates, average SOC and its deviation, ambient temperature, and amount of (Watt hour) W.h throughput. These parameters will be available in "CYC data" block in FIG. 3 after being determined from battery charge/discharge profile(s).

On the other hand, CALENDAR aging is usually affected by ambient temperature, storage SOC (i.e., the SOC of the battery at the beginning of the idle period) and the length of the time which the battery sits idle. Input parameters to the CALENDAR aging model are passed to "CAL Data" block which will be determined by "Extracting Required Data" unit from battery charge/discharge profile.

It is worth noting at this point that any individual CYCLING and CALENDAR aging model can be utilized in an integration framework according to the present disclosure without loss of generality. It is also useful to note that the above parameters are only applicable to the models used herein and can be changed using new models—if appropriate. Regardless of the individual CYCLING and CALENDAR aging models, the input data are battery charge/discharge profile and individual models of two different aging process(es). In addition to the input parameters of individual CYCLING and CALENDAR aging model(s), these models employ other parameters for re-sampling and unifying input data, accompanying the ANN model itself.

"CYC ANN Model" block contains the original ANN-based CYCLING aging model maximum W.h throughput sampling interval and maximum W.h throughput acceptable as the end of the dataset. Likewise, "CAL ANN Model" block includes the original ANN-based CALENDAR aging model, maximum sampling interval of accumulated days, and the end of the acceptable data (i.e., maximum accumulated days in the new dataset).

Pre-Processing Unit

Figure 3:
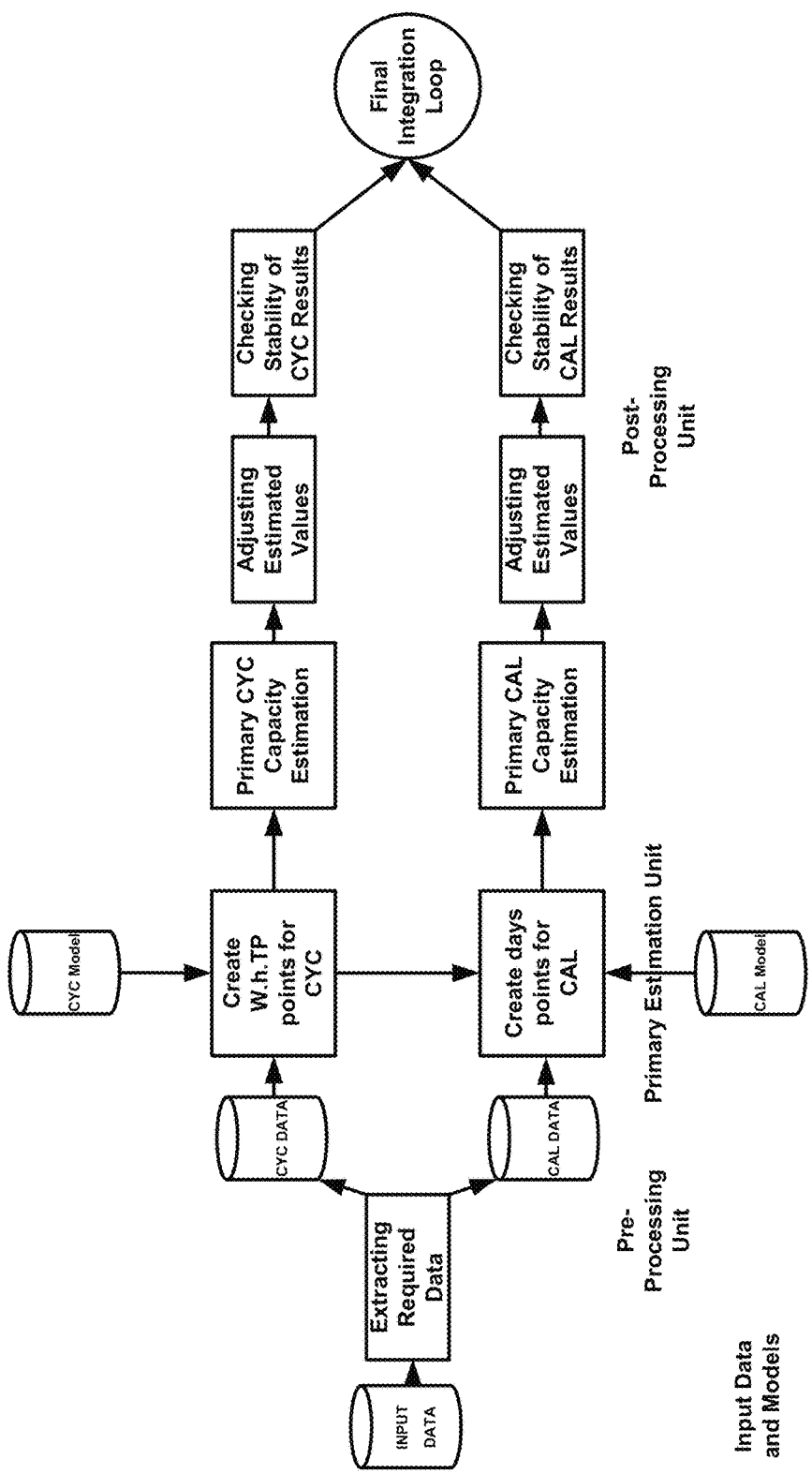
FIG. 3 is a schematic flow diagram showing a battery degradation model integrating CYCLING and CALENDAR aging according to an aspect of the present disclosure.
Figure 4:
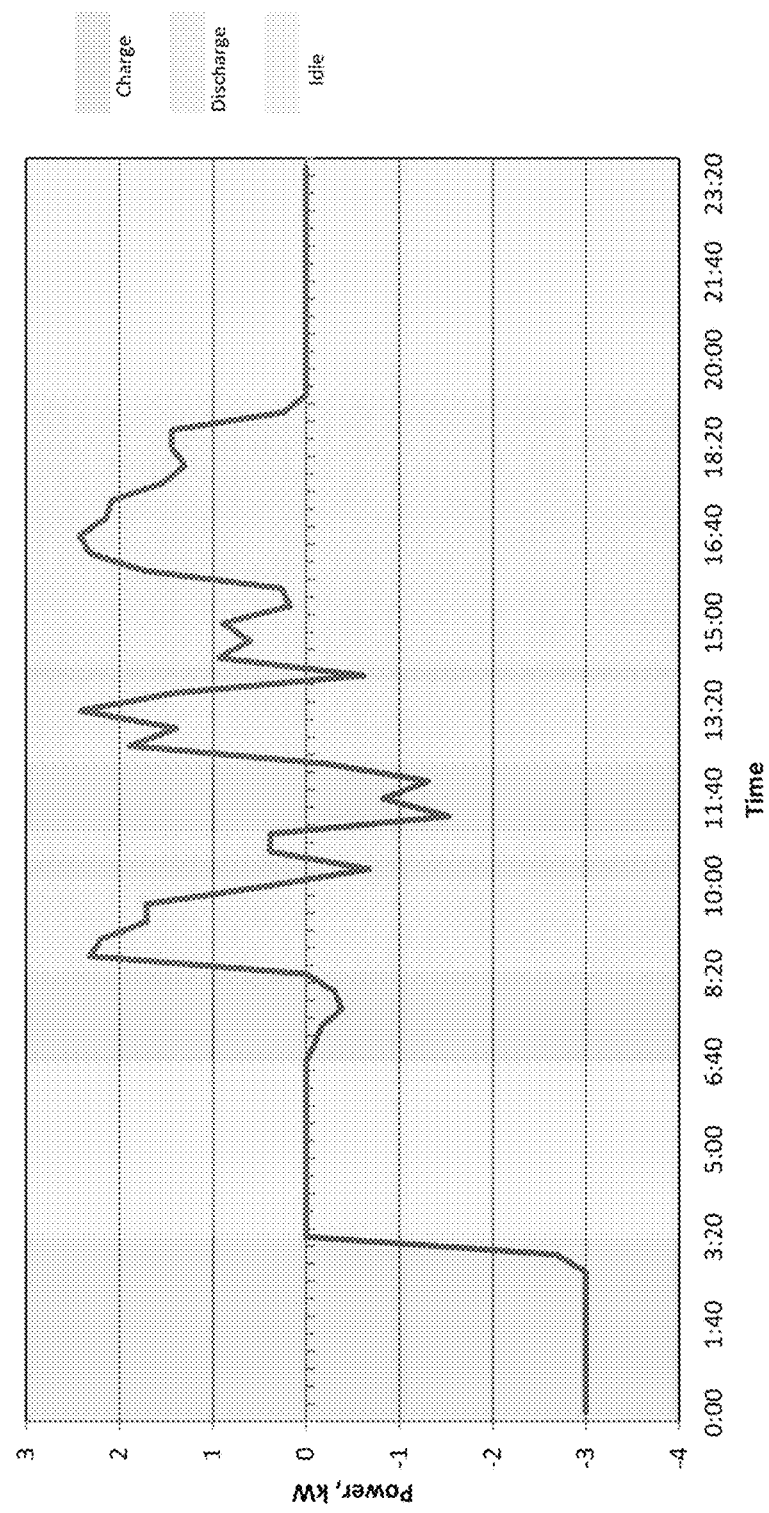
FIG. 4 is a plot showing a sample battery charge and discharge profile, given as input data to a framework according to an aspect the present disclosure.

With reference now to FIG. 3, there it shows a detailed flow diagram showing a battery degradation model integrating CYCLING and CALENDAR aging according to an aspect of the present disclosure. As shown in FIG. 3, the procedure starts with extracting required information from given data at input. Battery charge/discharge profile vs. time, previous estimated battery capacity, previous W.h throughput, initial SOC at the beginning of the profile, and ambient temperature are the given input data and parameters. A sample charge/discharge profile of such is shown in FIG. 4.

Since individual models are cyclic, one day of battery charge/discharge is required for estimation because its behavior is more likely to be a cyclic one. First, battery SOC will be determined using the given profile and the initial SOC of the battery. Then, average SOC will be the arithmetic average of the SOC values for the given profile. To determine SOC deviation, SOC estimations are divided into values greater and smaller than average SOC. The SOC deviation then is the difference between average of the greater values and the average of the smaller ones. In order to find charge and discharge rates, it is first required to determine normalized charge/discharge rates for individual events when battery is not idle. Normalized rate is the absolute value of battery power multiplied by the time interval divided by previous estimated battery capacity and battery voltage as follows:

$$C_{rate} \frac{|P_i| \times T}{C_{prev} \times V_{batt}}$$

Where $|P_i|$ is the absolute value of charge or discharge event i in Watt; T is the time interval of event i in Hour; $C_{prev}$ is the previous estimated capacity of the battery in A.h; and $V_{batt}$ is the battery voltage during the event, or simply the rated voltage. All values are for a battery cell. The average charge and discharge rates for the daily profile will be the arithmetic average rates of charge and discharges events, respectively. Extracted parameters will be saved in "CYC Data" for later use.

In order to compute CALENDAR aging, daily idle time and storage SOC will also be derived in "Extracting Required Data" bloc. Battery idle time is the accumulated time of the day when it sits idle, according to the given profile. Storage SOC is the average SOC of the battery at the beginning of all idle events in a day. Derived information will be saved in "CAL Data" block for later use.

Primary Estimation Unit

After determining required information from input data, primary battery capacity will be estimated for CYCLING and CALENDAR aging separately—assuming that the parameters will remain the same for the battery lifetime. For CYCLING aging, battery capacity will be estimated for different W.h throughput values while other parameters (i.e., "CYC Data") are kept constant. To do so, a vector of W.h throughput values is generated from zero to "maximum allowed W.h throughput" with interval of "maximum W.h throughput interval". For CALENDAR aging, battery capacity will be estimated versus accumulated storage time while other parameters stored in the "CAL Data" block will remain constant. Since it is desired to integrate the two aging models, it is required to estimate both degradation at the same point in time. As a result, CALENDAR aging will be estimated at the same point in time when CYCLING aging is estimated. In this manner, we calculate a vector of battery accumulated shelf time (for primary CALENDAR aging estimation) relative to every W.h throughput value created previously as follows:

$$T_{idle}(i) = \frac{E_{th}(i) \cdot T_{idle}^{daily}}{24 \times E_{daily}}$$

where $E_{th}(i)$ is the $i^{th}$ W.h throughput value in W.h; $T_{idle}^{daily}$ is the daily idle time of the battery in hours; and $E_{daily}$ is the daily W.h throughput. Note that this part of the determination is carried out in "Creating days points for CAL" block.

At this point, input parameters are ready for primary CYCLING and CALENDAR capacity estimation for all W.h throughput and shelf time created before, respectively. Other parameters required for each model is already derived from the given data and reside in "CYC Data" and "CAL Data" modules. Note that as used herein, battery capacity for individual CYCLING and CALENDAR aging will be determined using ANN models introduced to the framework in "Primary CYC Capacity Estimation" and "Primary CAL Capacity Estimation" separately. As was noted previously, any individual degradation model may be replaced with the ones employed herein without significant change.

Post-Processing Unit

Since individual degradation models are constructed using specific experimental data for specific battery capacity, estimated values also will be for the original battery size(s). To adjust the estimated value(s) based on a new battery capacity, "Adjusting Estimated Values" routine is employed for individual model(s) if a battery is different from an original battery. Additionally, this is useful when battery degrades and a new capacity is necessarily different from the original one.

Notably, this routine operates as follows. A battery original capacity is used as a first estimation. Then, the rest of the estimated values will be scaled according to the original battery capacity and the new one given by the user as follows:

$$C_{est}^{adj}(i) = \frac{C_{est}^{orig}(i) \cdot C_{given}}{C_{orig}}$$

where $c_{est}^{adj}(i)$ is the adjusted estimated ith value; $C_{est}^{orig}(i)$ is the original $i^{th}$ estimated value; $C_{given}$ is the battery capacity under study; and $C_{orig}$ is the capacity of the battery which ANN model is trained upon, all in A.h.

As is known, a battery is a sensitive device to different known and unknown parameters. This sensitivity shows a significant impact on the battery capacity measurement. Typically, battery capacity measured data can have significant outliers which deteriorates the performance of degradation model, e.g., ANN models. Usually, battery experimental data is limited to multiple laboratory experiments so removing outliers from data during modeling can reduce the number of available data for training which further might deteriorate battery model accuracy. As performed experimentally herein however, outliers are not removed—instead they are replaced with average(s) of previous and next estimated value(s). As battery degradation is expected to be monotonically decreasing by increasing W.h throughput (in CYCLING aging) and accumulated shelf time (in CALENDAR aging), we check the monotonicity of the estimated values for each individual model, i.e., stability check. If there are any outliers in the estimated values, they will be treated similarly. This procedure is performed in "Checking Stability of CYC Results" and "Checking Stability of CAL Results" for CYCLING and CALENDAR estimation, respectively.

Final Estimation

So far, we have described the estimation of individual CYCLING and CALENDAR aging for a hypothetical lifetime of the battery followed by adjusting original capacity and checking the stability of the results. We now do the final estimation where CYCLING and CALENDAR aging are integrated for the lifetime of the battery. This final estimation is performed in the "Final Integration Loop" of FIG. 3.

As may be appreciated, one significant consideration to be addressed is the impact of each degradation on the other, i.e., the impact of CYCLING on AGING and vice-versa. Notably, when a battery is experiencing a CALENDAR aging, it imposes extra capacity face which is not observed in an individual CYCLING model—and vice versa. In other words, a battery operating point at the beginning of each individual estimation will be different from those calculated by individual CYCLING and CALENDAR aging models. Therefore, it is required to modify battery operational point (i.e., actual W.h throughput in CYCLING aging, and actual accumulated shelf time in CALENDAR aging) before carrying out a new estimation. To do so, a method such as that depicted in FIG. 5 and FIG. 6 is developed and discussed.

Figure 5:
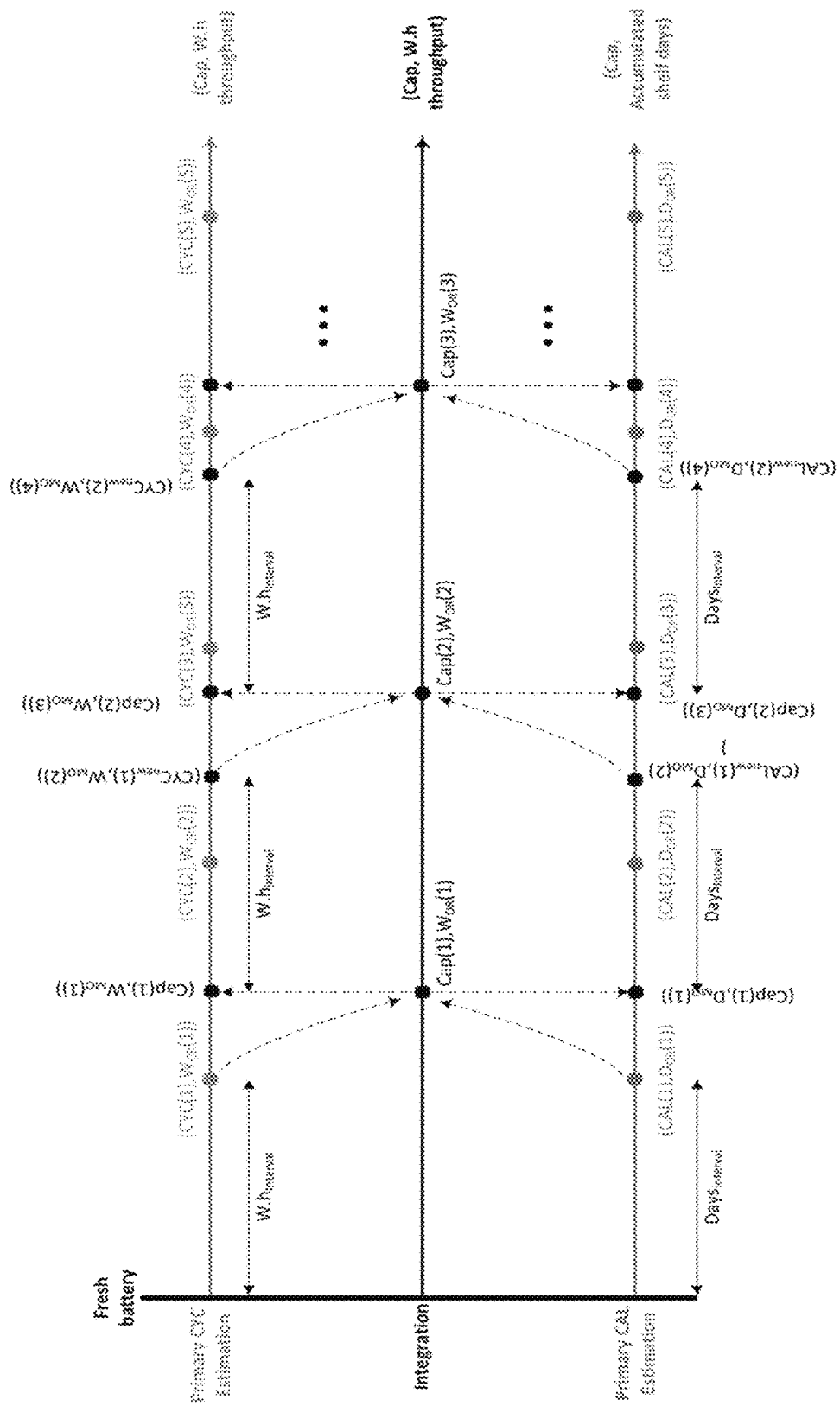
FIG. 5 is a schematic diagram depicting an overview of the final integration loop of FIG. 3 according to an aspect of the present disclosure.
Figure 6:
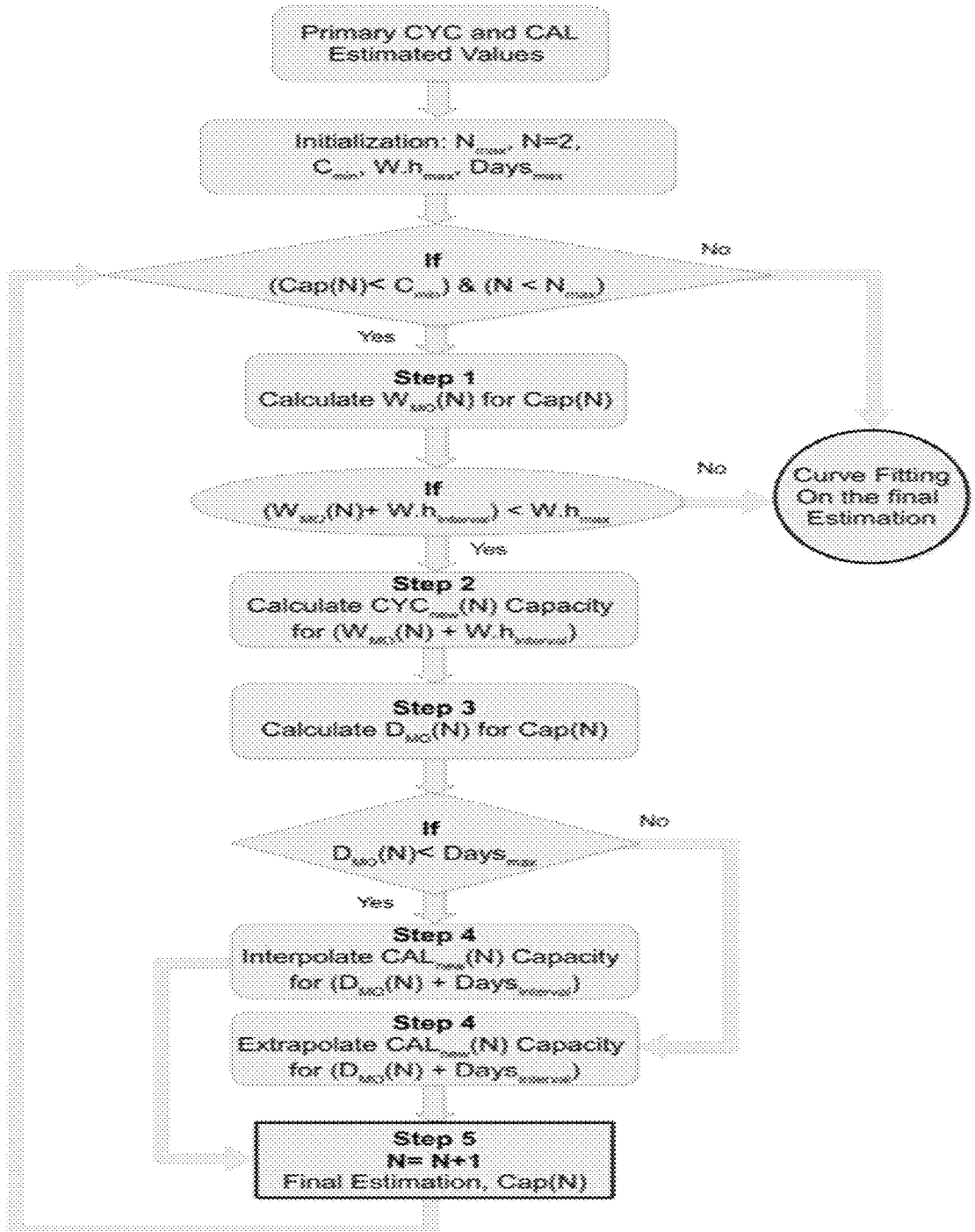
FIG. 6 is a schematic block diagram depicting an overview of the final integration loop of FIG. 3—according to an aspect of the present disclosure.

Turning now to FIG. 5, there is shown a general overview of an integration loop according to the present disclosure. As may be observed in that FIG. 5, are the primary CYCLING estimated aging and associated shelf time. Integrated degradation values and procedures are shown as well as CYC(i) being the ith primary estimated CYCLING aging value in A.h; $W_{OR}(i)$ is the ith original W.h throughput value associated with CYC(i) in W.h; W.h$_{interval}$ is the interval of W.h throughput which is given by the CYC ANN Model in W.h; and $W_{MO}(i)$ CAL(i) is the ith primary estimated CALENDAR aging value in A.h; $D_{OR}$ is the original shelf time value associated with CAL (i) in days; and Days$_{Interval}$ is the time interval of accumulated shelf time of the battery determined by CAL ANN Model. These are the results of primary CYCLING and CALENDAR aging, shown previously in FIG. 2.

For integrated aging values, Cap(i) is the ith integrated capacity in A.h. In the first iteration, battery starts fresh so CYCLING and CALENDAR agings will start from the same battery capacity which is the original value.

First, integrated battery capacity (Cap(1)) will be the original capacity subtracted from CYCLING AND CALENDAR faded values. To calculate second integrated capacity, we first need to compute modified W.h ($W_{MO}(1)$) and shelf time ($D_{MO}(1)$) based on the new battery capacity, i.e., Cap(1).

Then, new CYCLING capacity (CYC$_{NEW}(1)$) will be calculated for $W_{MO}(2)$ in which the latter is equal to $W_{MO}(1)$ plus Days$_{Interval}$. This procedure is continued until the end of primary CYCLING or CALENDAR aging values are reached.

FIG. 6 shows a detailed flowchart depicting an integration loop according to the present disclosure. As is shown in that FIG. 6, the loop starts with primary CYCLING and CALENDAR estimation results. Iteration number, N, will be set to two at the beginning and maximum number of iteration (s), $N_{max}$, will be set to the number of CYCLING estimated values. The first iteration as explained above. Combined battery capacity, Cap(N), is the original battery capacity minus CYCLING and CALENDAR aging values. Minimum CYCLING battery capacity, $C_{min}$, will be set to the minimum estimated value in the CYCLING primary estimated values. The loop will stop when Cap(n) is less than $C_{min}$ or when $N_{max}$ is reached. As we shall show, the procedure may be conveniently identified as four steps as shown in FIG. 6 and outlined below.

Step 1: Since Cap(N) is the actual battery capacity considering both CYCLING and CALENDAR aging. Therefore, determining new CYCLING aging for the next point in W.h throughput vector requires modifying relative W.h value for Cap(N). In other words, W.h throughput is not represented Cap(N). The same rationale can be recognized for CALENDAR aging except that accumulated shelf time should be modified for the combined capacity fade, i.e., Cap(N). In order to calculate new W.h, $W_{MO}(N)$, a linear interpolation is preferred using primary CYCLING estimated capacity degradation.

Step 2: If $W_{MO}(N)+W.h_{interval}$ is less than W.h$_{max}$ (which is given as a parameter in "CYC ANN Model"), the new W.h throughput value is within the range of the values which ANN model is trained with. When outside of the range, loop will be terminated. Having the new W.h throughput value associated with Cap(N), we can determine the CYCLING degradation for the next W.h throughput value which $W_{MO}(N)+W.h_{interval}$, where W.h$_{interval}$ is the interval of W.h throughput fetched as input parameter from "CYC ANN Model" as shown in FIG. 3. Here, new CYCLING capacity estimation, CYC$_{(new)}(N)$, is determined using linear interpolation among primary CYCLING aging estimated values.

Step 3: When new CYCLING degraded capacity is determined, we determine battery new capacity as a result of the CALENDAR degradation for the next interval. Prior to do that and similar to CYCLING aging determination, we need to adjust accumulated shelf time for the new combined degraded capacity, i.e., Cap(N). This can be done by interpolation in the primary CAL estimated values for Cap(N).

Step 4: If the new accumulated shelf time, $D_{MO}(N)$, in this iteration is less than maximum available storage days in the primary CAL aging estimated values, we can carry out interpolation to determine a new CALENDAR aging capacity, i.e., $CAL_{new}(N)$ for this iteration. Otherwise, as shown in FIG. 6, an extrapolation is performed. In both cases, a linear operation is preferred because CALENDAR aging in normal ambient temperature (i.e., 40 degrees C.) usually follows a linear trend (based on experimental testing).

Having both CALENDAR and CYCLING aging determined in each iteration for new W.h throughput and new accumulated shelf time, we can then determine the total degraded capacity for the next iteration (i.e., N–N+1), as follows:

$$Cap(N+1)=CYC_{new}(N)+(Cap(N)-CAL_{new}(N))$$

where Cap(N+1) will be used as combined degradation value in the next iteration.

Finally, we note that combined battery capacity with W.h throughput values will be used to fit a curve for convenient use of the model developed at a later time. We note that a second order polynomial function is useful to fit this data. Other fitting models and techniques may advantageously be employed without changing the method according to the present disclosure.

Figure 7:
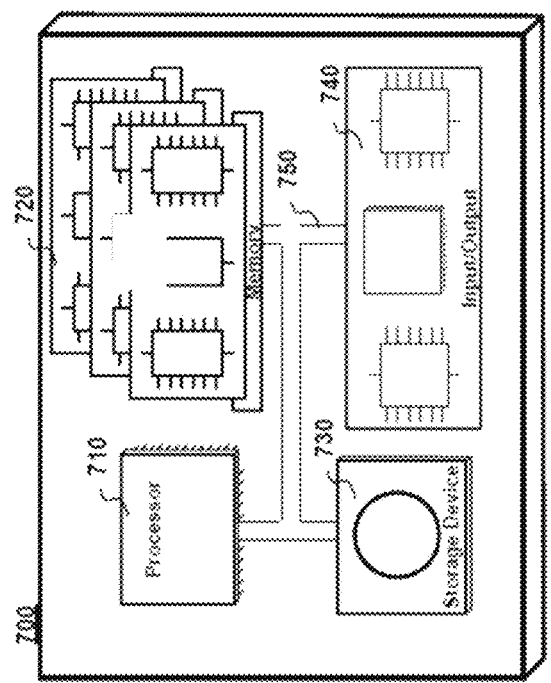
FIG. 7 is a block diagram of an illustrative computer system on which methods of the present disclosure may be implemented or which may be programmed to execute methods according to the present disclosure.

Finally, FIG. 7 shows an illustrative computer system 700 suitable for implementing methods and systems according to an aspect of the present disclosure. As may be immediately appreciated, such a computer system may be integrated into an another system such as a router and may be implemented via discrete elements or one or more integrated components. The computer system may comprise, for example a computer running any of a number of operating systems. The above-described methods of the present disclosure may be implemented on the computer system 700 as stored program control instructions.

Computer system 700 includes processor 710, memory 720, storage device 730, and input/output structure 740. One or more input/output devices may include a display 745. One or more busses 750 typically interconnect the components, 710, 720, 730, and 740. Processor 710 may be a single or multi core. Additionally, the system may include accelerators etc. further comprising the system on a chip.

Processor 710 executes instructions in which embodiments of the present disclosure may comprise steps described in one or more of the Drawing figures. Such instructions may be stored in memory 720 or storage device 730. Data and/or information may be received and output using one or more input/output devices.

Memory 720 may store data and may be a computer-readable medium, such as volatile or non-volatile memory. Storage device 730 may provide storage for system 700 including for example, the previously described methods. In various aspects, storage device 730 may be a flash memory device, a disk drive, an optical disk device, or a tape device employing magnetic, optical, or other recording technologies.

Input/output structures 740 may provide input/output operations for system 400 to one or more sensors/valves/relays/etc., that may be used to control and/or provide feedback to any chillers to which computer system 700 is communicatively coupled.

At this point, while we have presented this disclosure using some specific examples, those skilled in the art will recognize that our teachings are not so limited. Accordingly, this disclosure should be only limited by the scope of the claims attached hereto.

The invention claimed is:

1. An electrical generation, storage, and distribution system comprising:
   one or more electrical generation systems including fuel-based generators and renewable generators;
   one or more electrical storage systems (batteries) electrically interconnected to the electrical generation systems;
   an energy management system (EMS) that monitors the electrical generation, electrical storage, and any electrical loads placed upon the electrical generation, storage, and distribution system, said EMS including a battery degradation model and a computer system including:
   a pre-processing unit that takes a set of input data and produces a set of CYCLING data and a set of CALENDAR data from that input date, said CYCLING data including charge and discharge rates, average state of charge, ambient temperature, and watt-hour throughput, said CALENDAR data including state of charge and length of time a battery sits idle; said pre-processing unit further;
   a primary-estimation unit that separately estimates both CYCLING and CALENDAR aging separately wherein CYCLING aging determines battery capacity for different watt-hour throughput values while other parameters are kept constant by generating a vector of watt-hour throughput values from zero to a maximum allowed watt-hour throughput with an interval of maximum watt-hour throughput interval; and wherein CALENDAR aging determines battery capacity as a function of accumulated storage time while other parameters are kept constant;
   wherein the CYCLING and CALENDAR aging are both determined for a same point in time; and
   a post processing unit that determines battery capacity at a given point in time as compared with an original battery capacity according to the following:

$$C_{est}^{adj}(i) = \frac{C_{est}^{orig}(i) \cdot C_{given}}{C_{orig}}$$

where $C_{est}^{adj}(i)$ is an adjusted estimated ith value; $C_{est}^{orig}(i)$ is an original $i^{th}$ estimated value; $C_{given}$ is the battery capacity at a given point in time; and $C_{orig}$ is the capacity of the battery, all in amp-hours (A.h.).

* * * * *